(12) United States Patent
Jo et al.

(10) Patent No.: US 6,602,584 B2
(45) Date of Patent: Aug. 5, 2003

(54) FLEXIBLE PRINTED CIRCUIT BOARD WITH REINFORCING PLATE

(75) Inventors: Kyouyuu Jo, Ibaraki (JP); Yasufumi Miyake, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/119,027

(22) Filed: Apr. 10, 2002

(65) Prior Publication Data
US 2003/0042042 A1 Mar. 6, 2003

(30) Foreign Application Priority Data
Apr. 12, 2001 (JP) .................................... P2001-114509

(51) Int. Cl.⁷ ................................................ B32B 3/00
(52) U.S. Cl. ................ 428/209; 174/254; 174/255; 174/259; 252/519; 252/520; 252/521; 428/901
(58) Field of Search ................ 174/254, 255, 174/259; 428/209, 901; 252/519, 520, 521

(56) References Cited
U.S. PATENT DOCUMENTS
6,121,358 A * 9/2000 Dershem et al. ............ 524/439
6,274,225 B1 * 8/2001 Miyake et al. ............... 428/209
6,333,466 B1 * 12/2001 Miyaake et al. ............. 174/254
6,333,633 B1 * 12/2001 Honjo et al. ................. 324/537

* cited by examiner

*Primary Examiner*—Cathy Lam
(74) *Attorney, Agent, or Firm*—Sughrue Mion, PLLC

(57) ABSTRACT

A flexible printed circuit board with a reinforcing plate, which comprises: a flexible printed circuit board including i) a conductive circuit pattern layer, and ii) an insulating layer made of a plastic film; a reinforcing plate; and an adhesive layer so that the reinforcing plate is attached to the flexible printed circuit board via the adhesive layer, wherein the adhesive layer is formed from an adhesive composition containing a composite metal hydroxide represented by formula (1):

$$M_{1-x}Q_x(OH)_2 \quad (1)$$

wherein M is at least one metal atom selected from the group consisting of Mg, Ca, Sn and Ti; Q is at least one metal atom selected from the group consisting of Mn, Fe, Co, Ni, Cu and Zn; and x is a positive number from 0.01 to 0.5.

7 Claims, 2 Drawing Sheets

FLEXIBLE PRINTED CIRCUIT BOARD WITH REINFORCING PLATE

BACKGROUND OF THE INVENTION

1. Field of the Invention

The present invention relates to a flexible printed circuit board with a reinforcing plate having the excellent washing resistance and mounting resistance.

2. Description of the Related Art

Recently, realization of miniaturization or higher speed has been promoted in the field of the electronic appliances according to the progress of the electronic industry. Therefore, a lightweight flexible printed circuit board capable of packaging a three-dimensional wiring in a narrow space is used in a wider range with a higher demand. Accordingly, flexible printed circuit boards with reinforcing plates, prepared by attaching various kinds of reinforcing plates, such as a reinforcing thick plastic film, an engineering plastic plate, a glass epoxy laminated plate, and a metal plate serving also as a heat radiating plate, on a flexible printed circuit board with an adhesive in a part wherein parts are mounted, or in a part to be inserted in a connector are used frequently, and improvement of the performance thereof is desired.

In view of the circumstances, recently, a flexible printed circuit board with a reinforcing plate with not only the bonding property and the heat resistance but also the solder reflow resistance, the washing resistance, and the mounting resistance (screw fastening, or the like) at the time of packaging (mounting) the parts is called for. However, the conventional flexible printed circuit boards with a reinforcing plate have both advantages and disadvantages in the characteristics, and thus the above-mentioned characteristics are not always satisfied in the real situation.

SUMMARY OF THE INVENTION

The invention has been achieved in view of these circumstances, and an object thereof is to provide a flexible printed circuit board with a reinforcing plate having not only the bonding property and the heat resistance but also the excellent solder reflow resistance, washing resistance and mounting resistance at the time of packaging the parts.

In order to achieve the object, a flexible printed circuit board with a reinforcing plate, comprising a flexible printed circuit board having a conductive circuit pattern layer, and an insulating layer made of a plastic film, with a reinforcing plate attached via an adhesive layer, wherein the adhesive layer is provided using a composite metal hydroxide represented by formula (1):

$$M_{1-x}Q_x(OH)_2 \quad (1)$$

Wherein M is at least one metal atom selected from the group consisting of Mg, Ca, Sn, and Ti, Q is at least one metal atom selected from the group consisting of Mn, Fe, Co, Ni, Cu, and Zn, and x is a positive number from 0.01 to 0.5.

That is, the present inventors have studied elaborately for obtaining a flexible printed circuit board with a reinforcing plate having not only the bonding property and the heat resistance but also the excellent solder reflow resistance, washing resistance and mounting resistance at the time of packaging the parts. Then, they paid attention to the complex modulus of elasticity of the adhesive for the reinforcing plate of the flexible printed circuit board having a reinforcing plate, and further studied with the focus thereon. As a result, they have found out that a 100 MPa or more complex modulus of elasticity at 25° C. (generally 3,000 MPa or less as an upper limit) and a 10 MPa or more complex modulus of elasticity at 70° C. (generally 300 MPa or less as an upper limit) are preferable. In general, since those having a good peel strength, containing as the main component an epoxy resin-acrylonitrile butadiene rubber (NBR) or epoxy resin-acrylic based polymer component to be used at the time of attaching a reinforcing plate on a flexible printed circuit board have a low glass transition temperature, and a low complex modulus of elasticity, they have poor solder reflow resistance, washing resistance, and mounting resistance, and thus they are not suitable for use as an adhesive for adhering a reinforcing plate and a flexible printed circuit board. In contrast, those having a high glass transition temperature and a high complex modulus of elasticity have a lower peel strength. Moreover, in the conventional technique, usable reinforcing plates are limited. In particular, untreated aluminum plates are disadvantageous because they are not usable due to the poor bonding property. The invention is to solve the problems for providing a flexible printed circuit board with a reinforcing plate having the excellent bonding property as well as the excellent washing property and packaging property.

By setting the content of the composite metal hydroxide in a specific ratio, a desired high complex modulus of elasticity can easily be obtained so that an adhesive composition with a further superior bonding property can be obtained.

Figure 1:
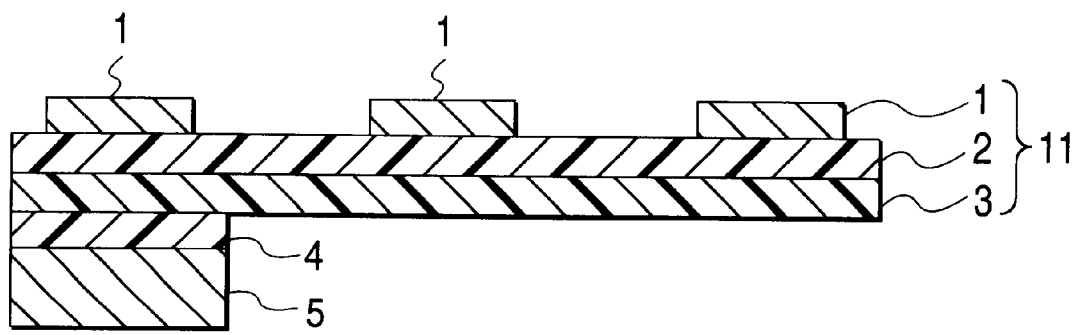
FIG. 1 is a cross-sectional view showing an embodiment of a flexible printed circuit board with a reinforcing plate of the invention.

The explanation of the reference numerals is set forth below.

| | |
|---|---|
| 1 | conductive circuit pattern |
| 2 | adhesive layer |
| 3 | plastic film |
| 4 | adhesive layer for a reinforcing plate |
| 5 | reinforcing plate |
| 11 | flexible printed circuit board |

DETAILED DESCRIPTION OF THE INVENTION

Next, embodiments of the invention will be explained in detail.

An embodiment of a flexible printed circuit board with a reinforcing plate according to the invention will be explained. A flexible printed circuit board 11 shown in FIG. 1 is a flexible printed circuit board with a conductive circuit pattern 1 laminated and formed on one side of a plastic film 3 via an adhesive 2. A reinforcing plate 5 is attached on a predetermined part of the other side of the plastic film 3 via an adhesive layer for a reinforcing plate 4. Although the conductive circuit pattern 1 is laminated and formed on the plastic film 3 via the adhesive layer 2 in FIG. 1, the conductive circuit pattern 1 may be laminated and formed directly on the plastic film 3 without using the adhesive layer 2.

As the plastic film 3, a polyimide film, a polyparabanic acid film, a polyester film, a polyethylene naphthalate film, a polyether sulfone film, a polyether imide film, a polyether ether ketone film, or the like can presented.

As the material for forming the adhesive layer 2 for attaching the conductive circuit pattern 1 on the plastic film 3, one containing a thermosetting resin component as the main component can be used. For example, thermosetting resin compositions having good insulating property and flexibility, such as an epoxy resin-acrylonitrile butadiene rubber (NBR) based composition, an epoxy resin-acrylic rubber based composition, an epoxy resin-polyester resin based composition, butyral, or the like, can be presented.

As to the material for forming the conductive circuit pattern 1, it is not particularly limited, and a metal foil having a good conductivity, such as a copper foil, an aluminum foil, a nichrome foil, or the like, can be presented. Moreover, the thickness thereof is not particularly limited, and it can be set optionally. The thickness thereof is generally set to 25 to 2,000 µm. As needed, plating of a metal such as tin, a solder, gold, and nickel may be provided on the surface of the metal foil.

As the reinforcing plate 5 to be attached on the other side of the plastic film 3, a thick plastic film, an engineering plastic plate such as a polyether imide, a glass epoxy resin laminated plate, various kinds of metal plates such as a stainless steel plate and an aluminum plate like an SUS, or the like, can be presented. The thickness thereof is generally set to about 25 to 2,000 µm.

The adhesive composition as the material for providing an adhesive layer for a reinforcing plate 4 for attaching the reinforcing plate 5 on the other side of the plastic film 3 can be obtained by using various kinds of polymer components as the main component, and adding the other additives thereto. As the adhesive composition as the material for providing the adhesive layer for a reinforcing plate 4 for attaching the reinforcing plate 5 of the flexible printed circuit board for a reinforcing plate of the present invention on the other side of the plastic film 3, a specific composite metal hydroxide can be used in addition to the components. The adhesive composition as the material for forming the adhesive layer for a reinforcing plate 4 is prepared as an adhesive solution (generally, the solid content being 25 to 50% by weight) with the components dissolved in a solvent so as to be provided for use. Here, the "main component" is referred to not only in terms of the amount of use but it denotes the main component substantially providing the adhesive composition as the material for forming the adhesive layer for a reinforcing plate 4, which significantly influences the physical property and the characteristics of the material for forming the adhesive layer for a reinforcing plate 4 (adhesive composition) as a whole.

The various kinds of the polymer components are not particularly limited, and various polymer components conventionally used as a material for forming an adhesive layer for a reinforcing plate 4 (adhesive composition), such as an epoxy resin can be presented.

As to the material for forming the adhesive layer for a reinforcing plate 4 (adhesive composition) of a flexible printed circuit board with a reinforcing plate of the present invention, an example of using an epoxy resin as the main component will be described.

As the epoxy resin, commonly used polyepoxy compounds having two or more epoxy groups in a molecule, such as a bisphenol A type compound, a naphthalene type compound, a cresol novolak type compound, a dicyclo type compound, a glycidyl ether type compound, and a cyclic aliphatic based compound can be used. In particular, it is preferable to use the bisphenol A type compound in terms of its good wettability with respect to a member to be attached, and the bonding property.

In the case the epoxy resin is used as the main component, a hardening agent is used. As to the hardening agent, it is not particularly limited and conventionally known agents can be used as long as they provide an effect as a hardening agent for an epoxy resin. Examples thereof include a novolak resin, an amine based resin, an acid anhydride, an imidazol, and a dicyan diamide. These can be used alone or in a combination of two or more. In particular, as the hardening agent, the novolak resin (especially, phenol novolak resin) is particularly preferable in terms of the heat resistance. The content of the hardening agent is preferably 0.25 to 0.75 hydroxide group equivalent with respect to 1 epoxy group equivalent of the epoxy resin. That is, with a less than 0.25 hydroxide group equivalent hardening agent content, the glass transition temperature, the washing resistance, and the mounting resistance tend to be lowered. In contrast, with a more than 0.75 hydroxide equivalent, the bonding property with respect to the reinforcing plate tends to be lowered.

A hardening accelerator can be used together with the hardening agent. As the hardening accelerator, an imidazol complex of a $BF_3$, imidazols, a triphenyl phosphine (TPP), or the like can be presented. In the case of using the imidazols, it is preferable to set the content at 0.1 to 1.0 part with respect to 100 parts by weight (hereinafter abbreviated as "part") of the epoxy resin.

In the present invention, in general, the material for forming the adhesive layer for a reinforcing plate 4 (adhesive composition) is provided for use in a film-like state. Therefore, it is preferable to include a flexibility providing agent, particularly preferably a rubber component. As the flexibility providing agent, a carboxyl group containing acrylonitrile butadiene rubber, an acrylic rubber, a polyester resin, or the like can be presented. These can be used alone or in a combination of two or more. The content of the flexibility providing agent is preferably 30 to 70 parts with respect to the total amount 100 parts of the epoxy resin and hardening agent components. That is, with more than 70 parts of the flexibility providing agent, the glass transition temperature and the chemical resistance tend to be lowered. In contrast, with less than 30 parts, the cracking phenomenon can easily be generated at the time of peeling off from the supporting base material without hardening so that the bonding property with respect to the reinforcing plate tends to be lowered.

In order to realize a flexible printed circuit board with a reinforcing plate having the excellent bonding property as well as the excellent washing resistance and mounting resistance, a composite metal hydroxide with a polygonal shape, represented by formula (1) is used in the invention:

$$M_{1-x}Q_x(OH)_2 \tag{1}$$

wherein M is at least one metal atom selected from the group consisting of Mg, Ca, Sn, and Ti, Q is at least one metal atom selected from the group consisting of Mn, Fe, Co, Ni, Cu, and Zn, and x is a positive number from 0.01 to 0.5.

The composite metal hydroxide has a polygonal shape, and according to a composite metal hydroxide having a polygonal crystal shape, by controlling various conditions, or the like in a production step of a composite metal hydroxide, a composite metal hydroxide can be obtained with a large crystal growth not only in the longitudinal and lateral directions but also in the thickness direction (c axis direction) in a desired polygonal shape, such as a substantially dodecahedron, a substantially octahedron, a substantially tetrahedron.

An example of the composite metal hydroxide with a polygonal shape used in the present invention has a polygonal structure of a substantially octahedron crystal shape, and it is prepared so as to have about a 1 to 8, preferably 1 to 7, and particularly preferably 1 to 4 aspect ratio. For example, in the case of M=Mg, and Q=Zn in the formula (1), it can be produced as follows. That is, a zinc nitrate compound is added to a magnesium hydroxide so as to produce a partial metal hydroxide as the material. Then, by baking the material in a range of 800 to 1,500° C., preferably in a range of 1,000 to 1,300° C., a composite metal oxide, which is represented as the composition of m(MgO).n(ZnO) is produced. By the hydration reaction at 40° C. or more while strongly agitating the same in an aqueous medium with about 0.1 to 6 mol % with respect to the composite metal oxide of at least one selected from the group consisting of a carboxylic acid, a metal salt of a carboxylic acid, an inorganic acid, and a metal salt of an inorganic salt coexisting, a composite metal hydroxide with a polygonal shape according to the present invention, represented by $Mg_{1-x}Zn_x(OH)_2$ (x is a positive number from 0.01 to 0.5) can be produced.

In the production method, as the material, not only the partial metal hydroxide to be obtained in the above-mentioned method, but also a metal hydroxide, a mixture of a magnesium hydroxide and a Zn, a mixture of a magnesium oxide and a Zn oxide, a mixture of a magnesium carbonate and a Zn carbonate, or the like, obtained by the coprecipitation method can be used as well. Moreover, as to the agitation at the time of the hydration reaction, in order to improve the homogeneity and the dispersion property, and improve the contact efficiency with respect to at least one selected from the group consisting of a carboxylic acid, a metal salt of a carboxylic acid, an inorganic acid and a metal salt of an inorganic acid, strong agitation is preferable, and further strong high shearing agitation is more preferable. The agitation is executed preferably by a rotation blade type agitating machine with a 5 m/s or higher rotation blade circumferential speed.

The carboxylic acid is not particularly limited, and preferable examples thereof include a monocarboxylic acid, an oxycarboxylic acid, (oxy acid), or the like. As the monocarboxylic acid, for example, a formic acid, an acetic acid, a propionic acid, a butyric acid, a valeric acid, a capronic acid, an acrylic acid, a crotonic acid, or the like can be presented. As the oxycarboxylic acid (oxy acid), for example, a glycolic acid, a lactic acid, a hydroacrylic acid, an α-oxy butyric acid, a glyceric acid, a salicylic acid, a benzoic acid, a gallic acid, or the like, can be presented. Moreover, the metal salt of a carboxylic acid is not particularly limited, and preferable examples thereof include a magnesium acetate, a zinc acetate, or the like. The inorganic acid is not particularly limited, and preferable examples include a nitric acid, a hydrochloric acid, or the like. Furthermore, the metal salt of an inorganic acid is not particularly limited, and preferable examples thereof include a magnesium nitrate, a zinc nitrate, or the like.

Specific representative examples of the composite metal hydroxides with a polygonal shape include $Mg_{1-x}Ni_x(OH)_2$ [0.01<X<0.5], $Mg_{1-x}Zn_x(OH)_2$ [0.01<X<0.5], or the like. As an example of a commercially available product of the composite metal hydroxide, ECOMAG produced by Tateho Chemical Industries Co., Ltd can be presented.

The composite metal oxide with a polygonal shape preferably has a 5 $\mu$m or less maximum particle size, particularly preferably a 1 $\mu$m or less maximum particle size because with more than a 5 $\mu$m maximum particle size, the precipitation rate in the varnish is too high so as to deteriorate the coating operativity, and the external appearance tends to be deteriorated due to generation of ruggedness on the surface of the adhesive layer.

Furthermore, it is preferable that the specific surface area of the composite metal hydroxide with a polygonal shape is in a range of 2.0 to 4.0 $m^2/g$. In the invention, the specific surface area of the composite metal hydroxide with a polygonal shape is measured by the BET adsorption method.

Moreover, in the invention, together with the composite metal hydroxide with a polygonal shape, the conventional composite metal hydroxide with a thin flat plate-like shape can be used.

As to the content of the composite metal hydroxide with a polygonal shape, it is set preferably in a range of 20 to 50% by weight, particularly preferably in a range of 28 to 44% by weight in the entire solid content constituting the adhesive composition as the material for forming the adhesive layer for a reinforcing plate 4 of the flexible printed circuit board with a reinforcing plate. That is, with a less than 20% by weight content of the composite metal hydroxide, it is difficult to obtain a desired high complex modulus of elasticity, and in contrast, with a more than 50% by weight content, the bonding property tends to be lowered.

The adhesive composition as the material for forming the adhesive layer for a reinforcing plate 4 of the flexible printed circuit board with a reinforcing plate of the invention can be obtained, for example, by mixing the above-mentioned components provided by an optional ratio.

In the case the adhesive composition as the material for forming the adhesive layer for a reinforcing plate 4 of the flexible printed circuit board with a reinforcing plate of the present invention is used, it is used as a solution dissolved in a solvent. As the solvent, a methyl ethyl ketone, a toluene, an ethylene glycol monomethyl ether, an ethylene glycol monoethyl ether, a dioxane, a methyl cellosolve acetate, or the like, can be presented. These can be used alone or in a combination of two or more. For reference, the "solid content constituting the adhesive composition" does not include this solvent, because the solvent is a volatile component.

As mentioned above, the flexible printed circuit board with a reinforcing plate comprises the conductive circuit pattern 1 laminated and formed on one side of the plastic film 3 (see FIG. 1), but the configuration is not limited thereto, and the invention can be adopted also in a multiple layer flexible printed circuit board, such as a both side flexible printed circuit board with a conductive pattern formed on both sides of a plastic film.

Figure 2:
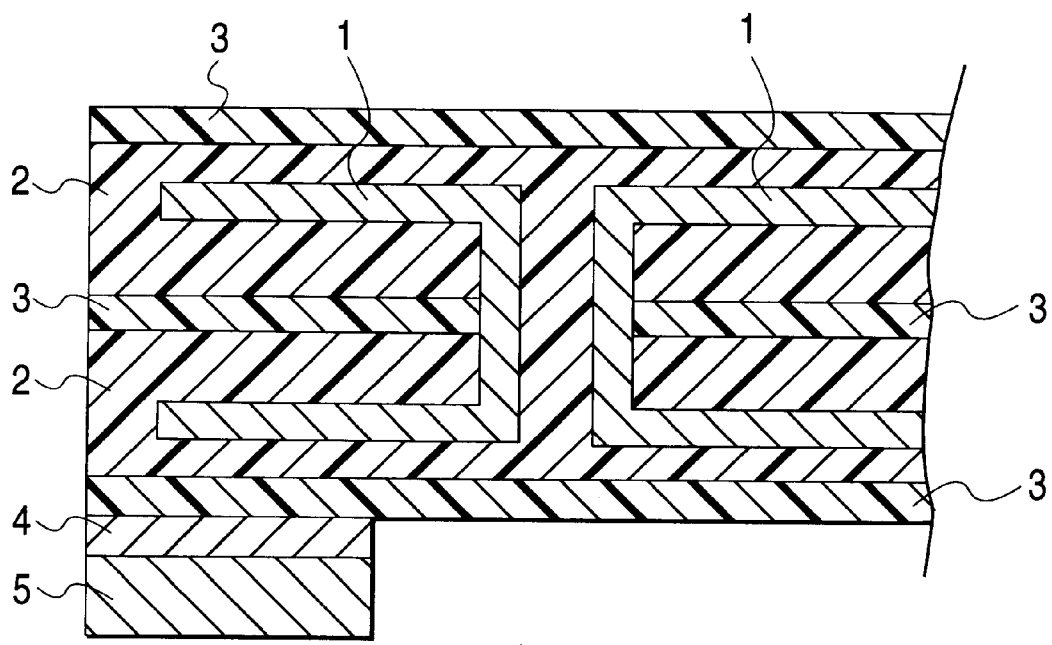
FIG. 2 is a cross-sectional view showing another embodiment of a flexible printed circuit board with a reinforcing plate of the invention.

FIG. 2 shows another embodiment of the invention. The flexible printed circuit board comprises a conductive circuit pattern 1 laminated and formed on both sides of a plastic film 3 via an adhesive layer, and further, a plastic film 3 laminated and formed on the outer circumference of the conductive circuit patterns 1 via an adhesive layer. Furthermore, a reinforcing plate 5 is attached on a predetermined part on one side of the plastic films 3 via an adhesive layer for a reinforcing plate 4.

Next, examples and a comparative example will be explained.

EXAMPLE 1

[Production Method for a Material for Forming an Adhesive Layer (Adhesive Composition)]

Figure 3:
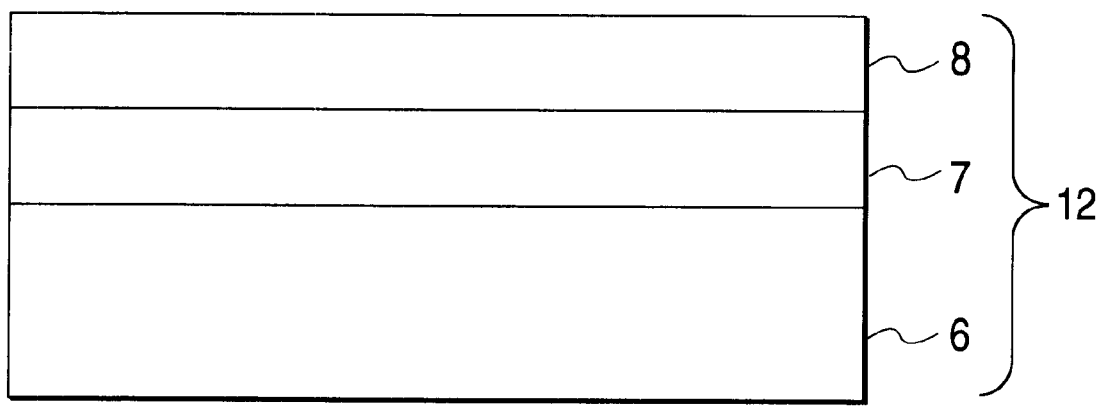
FIG. 3 is a side view showing a film-like adhesive in a three layer structure for adhering a reinforcing plate.

(A) epoxy resin: bisphenol A type epoxy resin (epoxy equivalent 457, melting point 70° C.)
(B) hardening agent: phenol novolak resin (hydroxide group equivalent 106)
(C) hardening accelerator: 2-undecyl imidazol [0041]
(D) flexibility providing agent: acrylonitrile butadiene rubber containing a carboxylic group
(E) composite metal hydroxide: $Mg_{0.8}Zn_{0.2}(OH)_2$ The components (A) to (E) prepared according to the composition table shown in the table 1 were agitated, dissolved and dispersed in a solvent mixture of a toluene, and an ethylene glycol monomethyl ether (mixing ratio 1:1) so as to have a 40% by weight solid component by a disperser for preparing an adhesive varnish. It was coated on a PET (polyethylene terephthalate) film treated by a mold releasing process (silicon process) by a 50 μm thickness as the supporting base material by a reverse coater so as to have a 25 μm thickness after drying. An adhesive film was obtained by drying the solvent thereof for 3 minutes in a 100° C. hot air circulating type drier. In order to improve the productivity, the operativity, the storage property, and further, the portability, a PET film treated by a mold releasing process (silicone process) of a 25 μm thickness was superimposed on the surface with the adhesive film exposed for protection by a roll laminator so as to produce a film-like adhesive 12 with a three layer structure for adhering a reinforcing plate on a flexible printed circuit board with a reinforcing plate, with mold releasing films 6, 8 made of a PET film laminated each on both sides of the adhesive (7) as shown in FIG. 3.

With the mold releasing film 8 on one side peeled off, the film-like adhesive 12 was laminated on an end terminal region (10 mm×10 mm) of a one side flexible printed circuit board for a hard disc drive (HDD) by a 80° C. heat roll. Then, with the remaining mold releasing film 6 peeled off, it was laminated with each of reinforcing plates (1) to (5) of a 10 mm square size [(1) aluminum plate without surface treatment (A5052-H34, 0.2 mm thickness); (2) aluminum plate with surface chemical conversion treatment (A5052-H34, 0.2 mm thickness); (3) SUS plate (SUS304-H, 0.2 mm thickness); (4) polyimide (0.125 mm thickness); (5) polyether imide (0.5 mm thickness)] by a 120° C. heat roll. Furthermore, it was heated and hardened at 150° C. for 5 hours so as to obtain a flexible printed circuit board with a reinforcing plate.

EXAMPLE 2, 3 AND COMPARATIVE EXAMPLE

Based on the method shown in the example 1, film-like adhesives in a three layer structure were produced according to the composition table shown in the table 1. Then, in the same manner as in the example 1, flexible printed circuit boards with a reinforcing plate were obtained.

TABLE 1

|  | Example | | | (Part) Comparative example |
|---|---|---|---|---|
|  | 1 | 2 | 3 | |
| Solid content | | | | |
| (A) Epoxy resin | 100 | 100 | 100 | 100 |
| (B) Hardening agent | 6 | 6 | 6 | 6 |
| (C) Hardening accelerator | 1 | 1 | 1 | 1 |
| (D) Flexibility providing agent | 40 | 40 | 40 | 40 |
| (E) Metal hydroxide | 60 | 90 | 140 | 0 |
| Solvent | | | | |
| Toluene | 150 | 180 | 220 | 110 |
| Ethylene glycol monomethyl ether | 150 | 180 | 220 | 110 |
| Solid content (wt %) | 41 | 40 | 39 | 40 |

The characteristics of the flexible printed circuit boards with a reinforcing plate obtained in the examples 1 to 3 and the comparative example were measured and evaluated by the following methods. Results are shown in the table 2.

[Peel Strength Under Normal Condition]

Specimen: Flexible printed circuit board with a reinforcing plate, with the reinforcing plates (1) to (5) attached
Based on the JIS C 5616, the test was executed with the following conditions.
Peeling direction: 90° direction
Tensile side: one side flexible printed circuit board for HDD side
Measurement temperature: 23° C.
Peeling rate: 50 mm/min

[Peel Strength After Humidification]

Specimen: Flexible printed circuit board with a reinforcing plate, with the reinforcing plates (1) to (5) attached
Humidification condition: 60° C. temperature, 90% relative humidity, 24 hour left time
It was measured in the same manner as in the case of the above-mentioned peel strength under normal condition after taking off the specimen from a humidification vessel, and sufficiently eliminating the water droplets in the case water droplets are attached on the surface.

[Solder Heat Resistance]

Specimen: Flexible printed circuit board with a reinforcing plate, with the reinforcing plates (1) to (5) attached
Based on the JIS C 5616, the test was executed with the following conditions.
Solder bath temperature: 260° C.
Soaking time: 30 seconds
Evaluation items: Existence or absence of the external appearance abnormality, such as swelling and peel off was judged by the visual observation.
◯: no external appearance abnormality, such as swelling and peel off
×: with external appearance abnormality, such as swelling and peel off

[Glass Transition Temperature and Complex Modulus of Elasticity]

Specimen: only the film-like adhesive 12
With the mold releasing films 6, 8 on both sides peeled off, the film-like adhesive 12 was laminated in 50 layers so as to produce a plate-like compact by a press in a 1.1 mm thickness×12 mm width×50 mm length size. The shaping condition was as follows.
Temperature: 150° C.
Pressure: 2.942 MPa (30 kg/cm$^2$)
Time: 5 hours
With the above-mentioned specimen, the dynamic viscoelasticity was measured with the following condition.

Moreover, as to the glass transition temperature (Tg), the peak temperature of tan δ was used.
Measurement device: ARES viscoelasticity measuring system (produced by Reometric Scientific F.E. Corp.)
Measurement mode: torsion, temperature dependency
Inter-chucking distance: 31 mm
Measurement temperature: −50° C. to 200° C.
Temperature rise rate: 10° C./min
Frequency: 3 Hz

TABLE 2

|  | Example | | | Comparative example |
|---|---|---|---|---|
|  | 1 | 2 | 3 |  |
| Solder heat Resistance | | | | |
| Reinforcing plate (1) | ○ | ○ | ○ | ○ |
| Reinforcing plate (2) | ○ | ○ | ○ | ○ |
| Reinforcing plate (3) | ○ | ○ | ○ | ○ |
| Reinforcing plate (4) | ○ | ○ | ○ | ○ |
| Peel strength | | | | |
| Reinforcing plate (1) | 12 | 10 | 8 | 5 |
| Reinforcing plate (2) | 13 | 11 | 9 | 15 |
| Reinforcing plate (3) | 13 | 11 | 9 | 14 |
| Reinforcing plate (4) | 15 | 11 | 9 | — |
| Reinforcing plate (5) | 15 | 12 | 9 | — |
| Peel strength (after humidification) | | | | |
| Reinforcing plate (1) | 12 | 10 | 9 | 2 |
| Reinforcing plate (2) | 13 | 11 | 9 | 4 |
| Reinforcing plate (3) | 13 | 11 | 9 | 5 |
| Reinforcing plate (4) | 14 | 11 | 9 | — |
| Reinforcing plate (5) | 15 | 12 | 9 | — |
| Glass transition temperature | 80 | 80 | 80 | 60 |
| Complex modulus of elasticity (MPa) | | | | |
| 25° C. | 1900 | 2600 | 3000 | 750 |
| 70° C. | 60 | 80 | 300 | 5 |

As it is apparent from the table 2, the comparative example has a low peel strength with respect to the aluminum reinforcing plate without surface treatment (1) Moreover, although it has a high peel strength with respect to the reinforcing plates (2) and (3), the peel strength after humidification was drastically lowered.

In contrast, in the case of the examples 1 to 3, in either case the excellent peel strength was provided with respect to all the reinforcing plates (1) to (5) including the aluminum reinforcing plate without the surface treatment (1) and the polyether imide reinforcing plate, which attracts the attention as a material with the excellent chemical resistance and high temperature strength, and furthermore, the peel strength was not deteriorated after being left in a high temperature high humidity vessel of a 60° C. temperature and a 90% relative humidity.

Moreover, the conventional problem of a low glass transition temperature and a low complex modulus of elasticity in those having a good peel strength were solved in the examples 1 to 3, and since they have a 1,500 MPa or more elastic modulus at 25° C., and a 50 MPa or more elastic modulus at 70° C., a flexible printed circuit board with a reinforcing plate for application of mounting parts, or the like, having the excellent solder reflow resistance, washing resistance, and mounting resistance can be provided.

As heretofore explained, the invention provides a flexible printed circuit board with a reinforcing plate with a reinforcing plate attached via an adhesive layer formed using an adhesive composition containing a composite metal hydroxide represented by the formula (1) Therefore, the adhesive layer has a high complex modulus of elasticity with a high glass transition temperature, a high adhering strength, the excellent heat resistance as well as the excellent solder reflow resistance, and washing resistance mounting resistance (fastening, or the like) at the time of packaging parts.

By setting the content of the complex metal hydroxide in a specific ratio, a desired high complex modulus of elasticity can easily be obtained, and thus an adhesive composition with the further excellent bonding property can be obtained.

This application is based on Japanese patent application JP 2001-114509, filed Apr. 12, 2001, the entire content of which is hereby incorporated by reference, the same as if set forth at length.

What is claimed is:

1. A flexible printed circuit board with a reinforcing plate, which comprises:
   a flexible printed circuit board including i) a conductive circuit pattern layer, and ii) an insulating layer made of a plastic film;
   a reinforcing plate; and
   an adhesive layer so that the reinforcing plate is attached to the flexible printed circuit board via the adhesive layer,
   wherein the adhesive layer is formed from an adhesive composition containing a composite metal hydroxide represented by formula (1):

$$M_{1-x}Q_x(OH)_2 \quad (1)$$

wherein M is at least one metal atom selected from the group consisting of Mg, Ca, Sn and Ti; Q is at least one metal atom selected from the group consisting of Mn, Fe, Co, Ni, Cu and Zn; and x is a positive number from 0.01 to 0.5, wherein the conductive pattern is formed on one side of the flexible printed circuit board, and the reinforcing plate is attached on the other side of the flexible printed circuit board via the adhesive layer using the adhesive composition containing the composite metal hydroxide represented by the formula (1).

2. The flexible printed circuit board with a reinforcing plate according to claim 1, wherein the conductive pattern is formed on both sides of the plastic film, and a pair of plastic films are laminated to the conductive patterns via an adhesive layer, and the reinforcing plate is attached on one side of the flexible printed circuit board via the adhesive layer using the adhesive composition containing the composite metal hydroxide represented by the formula (1).

3. The flexible printed circuit board with a reinforcing plate according to claim 1, wherein the adhesive composition contains 20 to 50% by weight of the composite metal hydroxide.

4. The flexible printed circuit board with a reinforcing plate according to claim 1, wherein the composite metal hydroxide is $Mg_{1-x}Ni_x(OH)_2$, in which $0.01<X<0.5$.

5. The flexible printed circuit board with a reinforcing plate according to claim 1, wherein the composite metal hydroxide is $Mg_{1-x}Zn_x(OH)_2$, in which $0.01<X<0.5$.

6. The flexible printed circuit board with a reinforcing plate according to claim 1, wherein the adhesive layer has a complex modulus of elasticity at 25° C. of 100 MPa or more and a complex modulus of elasticity at 70° C. of 10 MPa or more.

7. The flexible printed circuit board with a reinforcing plate according to claim 1, wherein the adhesive layer has a complex modulus of elasticity at 25° C. of 100 to 3,000 MPa and a complex modulus of elasticity at 70° C. of 10 to 300 MPa.

* * * * *